(12) United States Patent
Konarski et al.

(10) Patent No.: US 6,342,577 B1
(45) Date of Patent: Jan. 29, 2002

(54) THERMOSETTING RESIN COMPOSITIONS USEFUL AS UNDERFILL SEALANTS

(75) Inventors: Mark M. Konarski, Old Saybrook; Zbigniew A. Szczepaniak, Middletown, both of CT (US)

(73) Assignee: Loctite Corporation, Rocky Hill, CT (US)

(*) Notice: Subject to any disclaimer, the term of this patent is extended or adjusted under 35 U.S.C. 154(b) by 0 days.

(21) Appl. No.: 09/269,067

(22) PCT Filed: Jul. 22, 1998

(86) PCT No.: PCT/US98/15578

§ 371 Date: May 28, 1999

§ 102(e) Date: May 28, 1999

(87) PCT Pub. No.: WO99/05196

PCT Pub. Date: Feb. 4, 1999

Related U.S. Application Data

(60) Provisional application No. 60/053,592, filed on Jul. 24, 1997.

(51) Int. Cl.$^7$ .................... C08G 59/68; C08G 65/08; C08F 283/00
(52) U.S. Cl. .................... 528/94; 528/93; 528/99; 525/486; 438/118
(58) Field of Search .................... 528/93, 94, 99; 174/52.5; 525/486; 438/118

(56) References Cited

U.S. PATENT DOCUMENTS

| | | | |
|---|---|---|---|
| 3,862,260 A | 1/1975 | Sellers et al. | 260/831 |
| 4,159,976 A | 7/1979 | Moran | 260/33.4 EP |
| 4,477,629 A | 10/1984 | Hefner, Jr. | 525/113 |
| 4,499,245 A | 2/1985 | Ikeguchi et al. | 525/417 |
| 4,528,366 A | 7/1985 | Woo et al. | 528/422 |
| 4,645,803 A | 2/1987 | Kohli et al. | 525/423 |
| 4,732,962 A * | 3/1988 | Atkins et al. | 528/94 |
| 4,742,148 A | 5/1988 | Lee et al. | 528/117 |
| 4,918,157 A | 4/1990 | Gardner et al. | 528/322 |
| 5,330,684 A | 7/1994 | Emori et al. | 252/512 |
| 5,534,356 A | 7/1996 | Mahulikar et al. | 428/615 |
| 5,969,036 A * | 10/1999 | Dershem | 528/99 |

FOREIGN PATENT DOCUMENTS

| | | | |
|---|---|---|---|
| GB | 1024288 | 3/1966 | |
| GB | 1305702 | 2/1973 | B65G/47/00 |
| JP | 55-112256 * | 8/1980 | |
| JP | 62 275 123 | 11/1987 | C08G/059/40 |
| JP | 10-178039 * | 6/1998 | |
| JP | 11-106481 * | 4/1999 | |
| WO | 85/02184 | 5/1985 | C07C/118/00 |
| WO | WO 89/08123 | 9/1989 | C08G/59/68 |
| WO | 96/20242 * | 7/1996 | |

* cited by examiner

*Primary Examiner*—Philip Tucker
(74) *Attorney, Agent, or Firm*—Steven C. Bauman

(57) ABSTRACT

The present invention provides a thermosetting resin composition useful as an underfilling sealant composition which rapidly fills the underfill space in a semiconductor device, such as a flip chip assembly which includes a semiconductor chip mounted on a carrier substrate, enables the semiconductor to be securely connected to a circuit board by short-time heat curing and with good productivity, and demonstrates acceptable heat shock properties (or thermal cycle properties). The thermosetting resin composition which is used as an underfilling sealant between such a semiconductor device and a circuit board to which the semiconductor device is electrically connected, includes an epoxy resin component and a latent hardener component. The latent hardener component includes a cyanate ester component and an imidizole component.

25 Claims, 1 Drawing Sheet

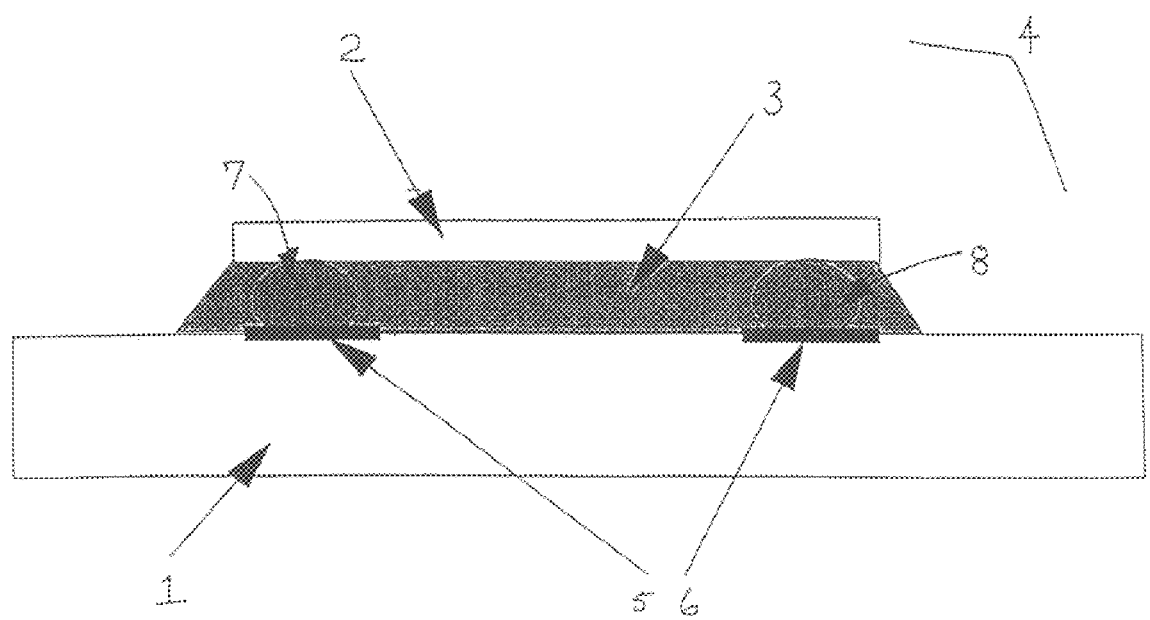

THERMOSETTING RESIN COMPOSITIONS USEFUL AS UNDERFILL SEALANTS

This application claims benefit to Ser. No. 60/053,592 filed Jul. 24, 1997.

BACKGROUND OF THE INVENTION

1. Field of the Invention

This invention relates to thermosetting resin compositions useful as underfill sealants for mounting under a circuit board direct chip attach ("DCA") packages, which have a semiconductor chip on a carrier substrate.

2. Brief Description of Related Technology

In recent years, the popularity of smaller-sized electronic appliances has made desirable size reduction of semiconductor devices. As a result, chip packages are becoming reduced in size to substantially that of the bare die themselves. Such smaller-sized chip packages improve the characteristics of the microelectronic device in which it is used, while retaining many beneficial operating features. This serves to protect semiconductor bare chips, and increases their reliability and useful life.

Ordinarily, chip assemblies are connected to electrical conductors on a circuit board by use of solder connection or the like. However, when the resulting chip/circuit board structure is subjected to conditions of thermal cycling, reliability becomes suspect due to fatigue of the solder connection between the circuit board and the chip assembly. Recent manufacturing advances provide a sealing resin (often referred to as underfill sealant) in the space created by the mounting of a DCA [such as a chip scale package ("CSP")/ball grid array ("BGA") assembly] onto a circuit board to relieve stresses caused by thermal cycling. Underfill sealants have been seen to improve heat shock properties and enhance the reliability of such structures.

Of course, curable resin compositions generally are known. See e.g., U.S. Pat. No. 4,645,803 (Kohli) which relates to curable epoxy resin compositions of reinforcing filaments and epoxy resins together with a primary amine-funtional curing agent with or without a polyamine curing agent and a curing catalyst which when cured into a fiber matrix is useful in preparing composites and prepreg materials for structural applications.

In addition, U.S. Patent No. 4,499,245 (Ikeguchi) relates to a curable resin composition requiring a mixture and/or a reaction product of (a) a polyfunctional cyanate ester, prepolymer of the cyanate ester or coprepolymer of the cyanate ester and an amine and (b) a polyhydantoin resin—a phenolic-based epoxy curative. In addition, a polyfunctional maleimide, prepolymer of the maleimide or coprepolymer of the maleimide and an amine may be included as a component (c). These compositions are reported to be useful as coating materials for rust prevention, flame resistance, flame retardation; electrical insulation varnish; and laminates for use with furniture, building materials, and sheathing materials.

And more specifically thermosetting compositions of cyanate esters and epoxy resins are also generally known. See e.g., Japanese patent document JP 62-275,123, an English-language abstract of which speaks to a resin composition for preparing prepreg materials with reinforcing fiber for structural applications. The compositions are reported to include certain cyanate esters, bismaleimide, polyether sulfone (as a non-reactive thermoplast whose use is as a toughening agent) and bisphenol F- or A-type epoxy resin. In addition, the composition is reported to be optionally hardened by a hardening catalyst, one of which is noted as imidazole.

U.S. Pat. No. 4,918,157 (Gardner) relates to the use of urea compounds as latent cure accelerators for cyanate esters, and to thermosetting cyanate ester formulations of cyanate esters and urea compounds. More specifically, the '157 patent claims a thermosetting composition of a cyanate ester; a urea compound selected from alkyl aryl ureas, aryl ureas and mixtures thereof; and an epoxy resin. The curable cyanate ester formulations of the '157 patent are reportedly useful as matrix resins, and for the production of prepreg, fiber-reinforced laminates, composites and the like.

Epoxy curing systems are also known. See e.g., U.S. Pat. No. 3,862,260 (Sellers), in which a curing agent of a trifunctional hardener (such as the reaction product of one mole of bisphenol A with one mole of formaldehyde) and an imidazole is disclosed.

These uses for thermosetting resin compositions appear to be directed to structural applications, as contrasted to the microelectronic application to which the compositions of the present invention are directed. To that end, the use of epoxy resin compositions as matrix compositions for fiber reinforcement in prepreg, composite and laminate materials for structural materials differs significantly from the use of epoxy resin compositions as an adhesive and encapsulant in microelectronic applications, such as with electrical solder junctions in semiconductor chips, and creates different demands and requirements from the uncured resin as well as cured reaction products thereof.

A drawback to resin compositions presently used in microelectronics applications, such as for underfill sealants, is their extended cure schedule. In addition, providing such resins with a commercially acceptable useful working life at room temperature or dispensing temperatures has been problematic.

Generally, at temperatures near room temperature, the resins begin to cure upon introduction of the curing agent or catalyst. This causes viscosity increases which leads to reduced dispensability. While such viscosity increase may be alleviated to some degree by using a liquid curing agent or catalyst, liquid catalysts tend to decrease latency to a point which is not commercially practical with current production demands. And introduction of a solid catalyst, such as imidazole, has limited applicability because its presence often changes the rheological properties of the composition, and decreases flow.

Thus, due at least in part to their extended cure schedules and limited useful working life, manufacturing capacity of certain microelectronic production lines has been hampered.

While seemingly simple, the solution to the problem of enhancing the cure speed of recently-used underfill sealants has ordinarily adversely impacted their useful working life. Thus, in the event that presently-used underfill sealants could be rendered more reactive, their useful working life may be further decreased, thereby removing the incentive to prepare a more reactive thermosetting resin composition for underfill sealing.

Accordingly, it would be desirable for an underfilling sealant composition to provide good adhesive properties while flowing and curing in a sufficiently quick time to be commercially appealing and possessing an extended useful working life.

SUMMARY OF THE INVENTION

The present invention provides a thermosetting resin composition useful as an underfilling sealant composition which (1) rapidly fills the underfill space in a semiconductor device, such as a flip chip assembly which includes a semiconductor chip mounted on a carrier substrate, (2) enables the semiconductor to be securely connected to a circuit board by short-time heat curing and with good productivity, and (3) demonstrates excellent heat shock properties (or thermal cycle properties).

The thermosetting resin compositions of this invention which are used as underfill sealants between such a semiconductor device and a circuit board to which the semiconductor device is electrically connected, includes an epoxy resin component and a latent hardener component. The latent hardener component includes a cyanate ester component and an imidazole component.

By using the thermosetting resin compositions of this invention, semiconductor devices, such as flip chip assemblies, may be (1) assembled quickly and without production line down time because of improved cure speed and extended useful working life, and (2) securely connected to a circuit board by short-time heat curing of the composition, with the resulting mounted structure (at least in part due to the cured composition) demonstrating excellent heat shock properties (or thermal cycle properties).

The compositions of this invention may also be used for microelectronic applications beyond sealing underfill, such as with glob top, die attachment and other applications for thermosetting compositions in which rapid cure time and an extended useful working life are desirable.

The benefits and advantages of the present invention will become more readily apparent after a reading of the "Detailed Description of the Invention" together with the figure.

BRIEF DESCRIPTION OF THE FIGURE

FIG. 1 depicts a cross-sectional view showing an example of a mounted structure with which the thermosetting resin composition of the present invention is used as an underfill sealant.

DETAILED DESCRIPTION OF THE INVENTION

As noted above, the thermosetting resin compositions which are useful as underfill sealants between a semiconductor device and a circuit board to which the semiconductor device is electrically connected, include an epoxy resin component and a latent hardener component. The latent hardener component includes a cyanate ester component and an imidazole component.

Typically, the composition includes about 100 parts by weight of the epoxy resin component, and 0 to about 30 parts by weight of the latent hardener component, of which 0 to about 15 parts is comprised of the cyanate ester component and 0 to about 15 parts is comprised of the imidazole component. Desirably, the latent hardener component should include about 4 parts each of the cyanate ester component and the imidazole component.

The epoxy resin component of the present invention may include any common epoxy resin. This epoxy resin may be comprised of at least one multifunctional epoxy resin, optionally, together with at least one monofunctional epoxy resin. Ordinarily, the multifunctional epoxy resin should be included in amount within the range of about 20 parts to about 100 parts of the epoxy resin component. In the case of bisphenol F-type epoxy resin, desirably the amount thereof should be in the range of from about 40 to 80 parts.

A monofunctional epoxy resin, if present, should ordinarily be used as a reactive diluent, or crosslink density modifier. In the event such a monofunctional epoxy resin is included as a portion of the epoxy resin component, such resin should be employed in an amount of up to about 20% by weight based on the total epoxy resin component.

The monofunctional epoxy resin should have an epoxy group with an alkyl group of about 6 to about 28 carbon atoms, examples of which include $C_6$–$C_{28}$ alkyl glycidyl ethers, $C_6$–$C_{28}$ fatty acid glycidyl esters and $C_6$–$C_{28}$ alkylphenol glycidyl ethers.

Such epoxy resin(s) include generally, but are not limited to, polyglycidyl ethers of polyvalent phenols, for example pyrocatechol; resorcinol; hydroquinone; 4,4'-dihydroxydiphenyl methane 4,4'-dihydroxy-3,3'-dimethyldiphenyl methane; 4,4'-dihydroxydiphenyl dimethyl methane; 4,4'-dihydroxydiphenyl methyl methane; 4,4'-dihydroxydiphenyl cyclohexane; 4,4'-dihydroxy-3,3'-dimethyldiphenyl propane; 4,4'-dihydroxydiphenyl sulfone; tris(4-hydroxyphyenyl)methane; polyglycidyl ethers of the chlorination and bromination products of the above-mentioned diphenols; polyglycidyl ethers of novolacs (i.e., reaction products of monohydric or polyhydric phenols with aldehydes, formaldehyde in particular, in the presence of acid catalyst; polyglycidyl ethers of diphenols obtained by esterifying 2 moles of the ethers of diphenols obtained by esterifying 2 moles of the sodium salt of an aromatic hydrocarboxylic acid with 1 mole of a dihaloalkane or dihalogen dialkyl ether (see U.K. Pat. No. 1,017,612, the disclosure of which is hereby expressly incorporated herein by reference); and polyglycidyl ethers of polyphenols obtained by condensing phenols and long-chain halogen paraffins containing at least two halogen atoms (see U.K. Pat. No. 1,024,288, the disclosure of which is hereby expressly incorporated herein by reference).

Other suitable epoxy compounds include polyepoxy compounds based on aromatic amines and epichlorohydrin, such as N,N'-diglycidyl-aniline; N,N'-dimethyl-N,N'-diglycidyl-4,4'-diaminodiphenyl methane; N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate.

Examples of the multifunctional epoxy resin include bisphenol A-type epoxy resin, bisphenol F-type epoxy resin, phenol novolac-type epoxy resin, and cresol novolac-type epoxy resin.

Among the epoxy resins suitable for use herein are polyglycidyl derivatives of phenolic compounds, such as those available commercially under the tradenames EPON 828, EPON 1001, EPON 1009, and EPON 1031, from Shell Chemical Co.; DER 331, DER 332, DER 334, and DER 542 from Dow Chemical Co.; and BREN-S from Nippon Kayaku, Japan. Other suitable epoxy resins include polyepoxides prepared from polyols and the like and polyglycidyl derivatives of phenol-formaldehyde novolacs, the latter of which are available commercially under the tradenames DEN 431, DEN 438, and DEN 439 from Dow Chemical Company. Cresol analogs are also available commercially ECN 1235, ECN 1273, and ECN 1299 from Ciba-Geigy Corporation. SU-8 is a bisphenol A-type epoxy novolac available from Interez, Inc. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba-Geigy Corporation and PGA-X and PGA-C from the Sherwin-Williams Co.

And of course combinations of the different epoxy resins are also desirable for use herein.

In choosing epoxy resins for the epoxy resin component of the compositions of the present invention, consideration should also be given to viscosity and other properties thereof.

The cyanate esters useful as a component in the latent hardening component may be chosen from aryl compounds having at least one cyanate ester group on each molecule and may be generally represented by the formula $Ar(OCN)_m$, where m is an integer from 2 to 5 and Ar is an aromatic radical. The aromatic radical Ar should contain at least 6 carbon atoms, and may be derived, for example, from aromatic hydrocarbons, such as benzene, biphenyl, naphthalene, anthracene, pyrene or the like. The aromatic radical Ar may also be derived from a polynuclear aromatic hydrocarbon in which at least two aromatic rings are attached to each other through a bridging group. Also included are aromatic radicals derived from novolac-type phenolic resins—i.e., cyanate esters of these phenolic resins. The aromatic radical Ar may also contain further ring-attached, non-reactive substituents.

Examples of such cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanato-biphenyl; bis(4-cyanatophenyl)methane and 3,3', 5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-(methylethylidene)]benzene and cyanated bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Pat. No. 1,305,702, and the cyanate esters disclosed in International Patent Publication WO 85/02184, the disclosure of each of which is hereby expressly incorporated herein by reference. Of course, combinations of these cyanate esters within the imidizole component of the compositions of the present invention are also desirably employed herein.

A particularly desirable cyanate ester for use herein is available commercially from Ciba Geigy Corporation, Tarrytown, N.Y. under the tradename AROCY 366 (1,3-bis [4-cyanatophenyl-1-(methylethylidene)]benzene).

The imidazole component of the latent hardener component include imidazoles, such as imidazole and derivatives thereof, such as isoimidazole, imidazole, alkyl substituted imidazoles, such as 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-phenylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole and the like, generally where each alkyl substituent contains up to about 17 carbon atoms and desirably up to about 6 carbon atoms; aryl substituted imidazoles, such as phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4-,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4, 2-naphthyl-4,5-diphenylimidazole, 1-benzyl-2-methylimidazole, 2-p-methoxystyrylimidazole, and the like generally where each aryl substituent contains up to about 10 carbon atoms and desirably up to about 8 carbon atoms.

Of course, combinations of these imidazoles are also desirable as the imidazole component of the latent hardener component of the compositions of the present invention.

The thermosetting resin compositions of the present invention may be of the one-pack type, in which all the ingredients are mixed together, or of the two-pack type in which the epoxy resin component and latent hardener component are stored separately and mixed together prior to use.

During application, the thermosetting resin compositions according to the present invention penetrate and flow readily into the space between the circuit board and the semiconductor device, or at least show a reduction in viscosity under heated or use conditions thus penetrating and flowing easily.

Generally, it is desirable to prepare the thermosetting resin compositions of this invention by selecting the types and proportions of various so that the gel times will be tailored to a specified period of time (such as 1 minute or 2 minutes) at a temperature of about 150° C. In such case, the inventive compositions should show no or substantially no increase of viscosity after a period of time of about six hours. With such a gel time, the compositions penetrate into the space between the circuit board and the semiconductor device (e.g., of 100 to 200 μm) relatively rapidly, and allow for a greater number of assemblies to be filled without observing a viscosity increase in the composition thereby rendering it less effective for application.

Optionally, the thermosetting resin composition of the present invention may further contain other additives such as defoaming agents, leveling agents, dyes, pigments and fillers. Moreover, the compositions may also contain photopolymerization initiators, provided such materials do not adversely affect the desired properties of the composition.

In an additional aspect of this invention, there is provided filled thermosetting compositions. These compositions, in addition to the epoxy resin component and latent hardener component, include a filler component. The filler component acts to lower moisture pick up, and tends to increase viscosity. Appropriate filler components include silica, alumina, silica-coated aluminum nitride, silver flake and the like.

Generally, about 0.1 to about 300 parts of the filler component may be used, with about 150 to 180 parts being desirable.

Reference to FIG. 1 shows a mounted structure (i.e., a flip chip package) in which a thermosetting resin composition of the present invention has been applied and cured.

The flip chip package 4 is formed by connecting a semiconductor chip (a bare chip) 2 to a carrier substrate 1

(e.g., a circuit board) and sealing the space therebetween suitably with a thermosetting resin composition 3. This semiconductor device is mounted at a predetermined position on the carrier substrate 1, and electrodes 5 and 6 are electrically connected by a suitable electrical connection means 7 and 8, such as solder. In order to improve reliability, the space between the semiconductor chip 2 and the carrier substrate 1 is sealed with a thermosetting resin composition 3, and then cured. The cured product of the thermosetting resin composition should completely fill that space.

Carrier substrates may be constructed from ceramic substrates of $Al_2O_3$, $SiN_3$ and mullite ($Al_2O_3$—$SiO_2$); substrates or tapes of heat-resistant resins, such as polyimides; glass-reinforced epoxy; ABS and phenolic substrates which are also used commonly as circuit boards; and the like. Any electrical connection of the semiconductor chip to the carrier substrate may be used, such as connection by a high-melting solder or electrically (or anisotropically) conductive adhesive, wire bonding, and the like. In order to facilitate connections, the electrodes may be formed as bumps.

In a typical mounting process, solder ball (e.g., in cream or form) may be printed at appropriate positions on a carrier substrate and suitably dried to expel solvent. A semiconductor chip may then mounted in conformity with the pattern on the carrier substrate. This carrier substrate is then passed through a reflowing furnace to melt the solder to connect the semiconductor chip. Moreover, the solder may be applied or formed on either the carrier substrate or the semiconductor chip. Alternatively, this connection may also be made by an electrically conductive adhesive or an anisotropically conductive adhesive.

After the semiconductor chip is electrically connected to the carrier substrate, the resulting structure is ordinarily subjected to a continuity test or the like. After passing such test, the semiconductor chip may be fixed thereto with a thermosetting resin composition, as described below. In this way, in the event of a failure, the semiconductor chip may be removed before it is fixed to the carrier substrate with the thermosetting resin composition.

Using a suitable application means, such as a dispenser, a thermosetting resin composition in accordance with this invention is applied to the periphery of the electronically-connected semiconductor chip. The composition penetrates by capillary action into the space between the carrier substrate and the semiconductor chip.

The thermosetting resin composition is then thermally cured by the application of heat. During the early stage of this heating, the thermosetting resin composition shows a significant reduction in viscosity and hence an increase in fluidity, so that it more easily penetrates into the space between the carrier substrate and the semiconductor chip. Moreover, by preheating the carrier substrate, the thermosetting resin composition is allowed to penetrate fully into the entire space between the carrier substrate and the semiconductor chip.

Cured reaction products of the thermosetting resin compositions of the present invention demonstrate excellent adhesive force, heat resistance and electric properties, and acceptable mechanical properties, such as flex-cracking resistance, chemical resistance, moisture resistance and the like, for the applications for which they are used herein.

The amount of thermosetting resin composition applied should be suitably adjusted so as to fill almost completely the space between the carrier substrate and the semiconductor chip, which amount of course may vary depending on application.

Thermosetting resin compositions of the present invention may ordinarily be cured by heating to a temperature in the range of about 120 to about 180° C. for a period of time of about 0.5 to 30 minutes. However, generally after application of the composition, an initial cure time of about 1 minute sets up the composition, and complete cure is observed after about 15 minutes at 150° C. Thus, the composition of the present invention can be used in relatively moderate temperatures and short-time curing conditions, and hence achieve very good productivity.

The present invention will be more readily appreciated with reference to the examples which follow.

EXAMPLES

In these examples, compositions in accordance with the present invention were prepared and evaluated for performance in contrast with compositions prepared without the cyanate ester component of the latent hardener component. Results are set forth below.

Example 1

Thermosetting Resin Composition—1 Minute Gel Time

A. A thermosetting resin composition for underfill applications in accordance with the present invention was prepared by mixing together with stirring for a period of time of about 10 minutes at room temperature in an open vessel an epoxy resin component including 92 parts by weight of bisphenol F-type epoxy resin, and a latent hardener component including 4 parts by weight of 2-ethyl-4-methylimidazole, and 4 parts by weight of 1,3-bis[4-cyanatophenyl-1-(methylethylidene)]benzene as a cyanate ester resin (commercially available under the tradename AROCY 366 from Ciba-Geigy).

While the composition was used upon formation, it may be stored for a period of time of up to about 3 to about 6 months at a temperature of about −20° C. without experiencing viscosity increase.

After formation, the composition was transferred to a 10 ml syringe made of non-reactive plastic, and the composition was dispensed through the 12 G needle of the syringe into the junction between the carrier substrate and semiconductor chip in a previously-formed assembly. As such, the composition acts as an encapulant for the electrical solder connection.

After dispensing was complete, the assembly was transferred to an oven while the temperature was maintained at about 150° C. The composition cured initially after about 1 minute, and thereafter cured completely after about 15 minutes at that temperature.

Separately, the composition was placed between a pair of lap shears and cured in the same way as the assembly above. The bound lap shears were removed from the oven and allowed to reach room temperature, at which point they were evaluated for bond strength. The cured composition was found to possess lap shear strength of about 1660 psi—which is acceptable for the microelectronic applications which the compositions are designed.

With respect to shelf-life stability, as noted above the gel time of the composition was tailored to 1 minute at a temperature of 150° C. This composition was observed to experience no viscosity increase at room temperature after a period of time of 6 hours; after a period of time of about 15 hours the viscosity increase was observed to be about 52%; and after a period of time of about 24 hours the viscosity increase was observed to be about 88%.

B. A comparable composition was prepared in which no cyanate ester was added. That composition included 96.5 parts bisphenol F-type epoxy resin and 3.5 parts of 2-ethyl-4-methylimidazole. The composition was also tailored to a gel time of about 1 minute at a temperature of 150° C. The lap shear strength was observed to be about 1670 psi.

This composition was applied as above, and demonstrated a viscosity increase at room temperature after a period of time of about 6 hours of about 13%; after a period time of about 15 hours of about 153% and after a period of time of 24 hours of about 267%.

Accordingly, it is seen that the presence of the cyanate ester component in the inventive compositions has a dramatic affect in maintaining a useful working life for the compositions with respect to slowing viscosity increase over time at room temperature.

Example 2

Thermosetting Resin Composition—2 Minute Gel Time

A. A thermosetting resin composition for underfill applications in accordance with the present invention was prepared by mixing together with stirring for a period of time of about 10 minutes at room temperature in an open vessel an epoxy resin component including 88 parts by weight of bisphenol F-type epoxy resin, and a latent hardener component including 8 parts by weight of 2-ethyl-4-methylimidazole, and 4 parts by weight of 1,3-bis[4-cyanatophenyl-1-(methylethylidene)]benzene as a cyanate ester resin (AROCY 366).

While this composition was used upon formation, it too may be stored for a period of time of up to about 3 to about 6 months at a temperature of about −20° C. without experiencing viscosity increase.

After formation, the composition was transferred to a 10 ml syringe made of non-reactive plastic, and the composition was dispensed through the 12 G needle of the syringe into the junction between the carrier substrate and semiconductor chip in a previously-formed assembly to act as an encapulant for the electrical solder connection.

After dispensing was complete, the assembly was transferred to an oven while the temperature was again maintained at about 150° C. The composition cured initially after about 2 minutes, and thereafter cured completely after about 15 minutes at that temperature.

This composition was also placed between a pair of lap shears and cured in the same way as the assembly above, and as in Example 1. The lap shears were removed from the oven and allowed to reach room temperature, at which point they were evaluated for bond strength. The cured composition was found to possess lap shear strength of about 1620 psi—which is acceptable for the microelectronic applications for which the compositions are designed.

With respect to shelf-life stability, as noted above the gel time of the composition was tailored to 2 minute at a temperature of 150° C. This composition was observed to experience a viscosity increase at room temperature after a period of time of 6 hours of about 3%; after a period of time of about 15 hours the viscosity increase was observed to be about 10%; and after a period of time of about 24 hours the viscosity increase was observed to be about 20%.

B. A comparable composition was prepared in which no cyanate ester was added. That composition included 97.5 parts bisphenol F-type epoxy resin and 2.5 parts of 2-ethyl-4-methylimidazole. The composition was also tailored to a gel time of about 2 minutes at a temperature of 150° C. The lap shear strength was observed to be about 1600 psi.

This composition was applied as above, and demonstrated a viscosity increase at room temperature after a period of time of about 6 hours of about 16%; after a period time of about 15 hours of about 82% and after a period of time of 24 hours of about 162%.

Accordingly, it is seen that the presence of the cyanate ester in the inventive compositions has a dramatic affect in maintaining a useful working life for the compositions with respect to slowing viscosity increase over time at room temperature.

What is claimed is:

1. A thermosetting resin composition capable of sealing underfilling between a semiconductor device and a circuit board to which said semiconductor device is electrically connected, said composition comprising:
   (a) about 100 parts of an epoxy resin component; and
   (b) a latent hardener component in an amount up to about 30 parts comprising
      (i) a cyanate ester component in an amount up to about 15 parts, and
      (ii) an imidazole component in an amount up to about 15 parts.

2. The composition of claim 1, wherein said epoxy resin comprises at least one multifunctional epoxy resin.

3. The composition according to claim 1, wherein the epoxy resin component includes members selected from the group consisting of $C_6$–$C_{28}$ alkyl glycidyl ethers; $C_6$–$C_{28}$ fatty acid glycidyl esters; $C_6$–$C_{28}$ alkylphenol glycidyl ethers; polyglycidyl ethers of pyrocatechol, resorcinol, hydroquinone, 4,4'-dihydroxydiphenyl methane, 4,4'-dihydroxy-3,3'-dimethyldiphenyl methane, 4,4'-dihydroxydiphenyl dimethyl methane, 4,4'-dihydroxydiphenyl methyl methane, 4,4'-dihydroxydiphenyl cyclohexane, 4,4'-dihydroxy-3,3'-dimethyldiphenyl propane, 4,4'dihydroxydiphenyl sulfone, and tris(4-hydroxyphyenyl)methane; polyglycidyl ethers of the chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; N,N'-diglycidyl-aniline; N,N'-dimethyl-N,N'-diglycidyl-4,4'diaminodiphenyl methane; N,N,N',N'-tetraglycidyl-4,4'diaminodiphenyl methane; N-diglycidyl-4-aminophenyl glycidyl ether; N,N,N',N'-tetraglycidyl-1,3-propylene bis-4-aminobenzoate; bisphenol A epoxy resin, bisphenol F epoxy resin, phenol novolac epoxy resin, and cresol novolac epoxy resin.

4. The composition according to claim 1, wherein the epoxy resin component includes bisphenol F epoxy resin and epoxy cresol novalac resin.

5. The composition according to claim 1, wherein the epoxy resin component includes about 80 parts bisphenol F epoxy resin and about 20 parts epoxy cresol novalac resin.

6. The composition according to claim 1, wherein the cyanate ester component is chosen from aryl compounds having at least one cyanate ester group on each molecule.

7. The composition according to claim 1, wherein the cyanate ester component is represented by $Ar(OCN)_m$, wherein Ar is an aromatic radical and m is an integer from 2 to 5.

8. The composition according to claim 1, wherein the cyanate ester component is selected from the group consisting of 1,3-dicyanatobenzene; 1,4-dicyanatobenzene; 1,3,5-tricyanatobenzene; 1,3-, 1,4-, 1,6-, 1,8-, 2,6- or 2,7- dicyanatonaphthalene; 1,3,6-tricyanatonaphthalene; 4,4'-dicyanato-biphenyl; bis(4-cyanatophenyl)methane and 3,3', 5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-(methylethylidene)]benzene and cyanated bisphenol-terminated polycarbonate or other thermoplastic oligomer.

9. The composition according to claim 1, wherein the cyanate ester component is 1,3-bis[4-cyanatophenyl-1-(methylethylidene)]benzene.

10. The composition according to claim 1, wherein the imidazole component is a member selected from the group consisting of imidazole, isoimidazole, 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole, phenylimidazol, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4-,5-diphenylimidazole, 2-(p-dimethyl-aminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, and the combinations thereof.

11. The composition according to claim 1, wherein the imidazole component is 2-ethyl-4-methylimidazole.

12. A thermosetting resin composition capable of sealing underfilling between a semiconductor device and a circuit board to which said semiconductor device is electrically connected, said composition comprising:
  (a) about 92 parts by weight of an epoxy resin component comprising bisphenol F epoxy resin, and
  (b) about 8 parts by weight of latent hardening component, of which 4 parts is comprised of (i) a cyanate ester component comprising 1,3-bis[4-cyanatophenyl-1-(methylethylidene)]benzene and 4 parts is comprised of (ii) an imidazole component comprising 2-ethyl-4-methylimidazole.

13. A thermosetting resin composition capable of sealing underfilling between a semiconductor device and a circuit board to which said semiconductor device is electrically connected, said composition comprising:
  (a) about 88 parts by weight of an epoxy resin component comprising bisphenol F epoxy resin, and
  (b) about 12 parts by weight of latent hardening component, of which 4 parts is comprised of a cyanate ester component comprising 1,3-bis[4-cyanatophenyl-1-(methylethylidene)]benzene and 8 parts is comprised of an imidazole component comprising 2-ethyl-4-methylimidazole.

14. The composition of claim 1, having a viscosity of less than about 50,000 mPa.s at a temperature of 25° C.

15. Reaction products of a composition according to claim 1.

16. A mounting structure for semiconductor devices, comprising:
  a semiconductor device comprising a semiconductor chip mounted on a carrier substrate, and
  a circuit board to which said semiconductor device is electrically connected,
wherein the space between the carrier substrate of said semiconductor device and said circuit board is sealed with a reaction product of a thermosetting resin composition according to claim 1.

17. A thermosetting resin composition capable of sealing underfilling between a semiconductor device and a circuit board to which said semiconductor device is electrically connected, said composition consisting essentially of:
  (a) about 100 parts of an epoxy resin component; and
  (b) a latent hardener component in an amount up to about 15 parts, and
    (i) a cyanate ester component in an amount up to about 15 parts, and
    (ii) an imidazole component in an amount up to about 15 parts; and
  (c) optionally, a filler;
  (d) optionally, a defoaming agent;
  (e) optionally, a leveling agent; and
  (f) optionally, a dye.

18. The mounting structure according to claim 16, wherein the thermosetting resin composition is in accordance with claim 17.

19. A process for fabricating semiconductor devices, said process comprising the steps of:
  electrically connecting a semiconductor device comprising a semiconductor chip mounted on a carrier substrate, to a circuit board;
  infiltrating a thermosetting resin composition into the space between the carrier substrate of said semiconductor device and said circuit board, wherein the thermosetting resin composition is in accordance with claim 1; and
  curing the thermosetting resin composition by the application of heat.

20. A thermosetting resin composition having a gel time at a temperature of about 150° C. of about two minutes or less, and capable of sealing underfilling between a semiconductor device and a circuit board to which said semiconductor device is electrically connected, said composition comprising:
  (a) an epoxy resin component; and
  (b) a latent hardener component comprising
    (i) a cyanate ester component, and
    (ii) an imidazole component.

21. A mounting structure for semiconductor devices comprising:
  a semiconductor device comprising a semiconductor chip mounted on a carrier substrate, and
  a circuit board to which said semiconductor device is electrically connected, wherein the space between the carrier substrate of said semiconductor device and said circuit board is sealed with a reaction product of a thermosetting resin composition according to claim 17.

22. A mounting structure for semiconductor devices, comprising:
  a semiconnductor device comprising a semiconductor chip mounted on a carrier substrate, and a circuit board to which said semiconductor device is electrically connected, wherein the space between the carrier substrate of said semiconductor device and said circuit board is sealed with a reaction product of a thermosetting resin composition according to claim 20.

23. The mounting structure according to claim 16, wherein the thermosetting resin composition is in accordance with claim 20.

24. The process according to claim 19, wherein the thermosetting resin composition is in accordance with claim 17.

25. The process according to claim 19, wherein the thermosetting resin composition is in accordance with claim 20.

* * * * *

UNITED STATES PATENT AND TRADEMARK OFFICE
CERTIFICATE OF CORRECTION

PATENT NO. : 6,342,577 B1
DATED : January 29, 2002
INVENTOR(S) : Mark M. Konarski et al.

It is certified that error appears in the above-identified patent and that said Letters Patent is hereby corrected as shown below:

Column 1,
Line 42, change "funtional" to -- functional --

Column 6,
Line 11, change "hydroxyphenyl-4-, 5-diphenylimidazole" to
-- hydroxyphenyl-4, 5-diphenylimidazole --

Column 7,
Line 24, before "mounted" insert -- be --

Column 9,
Line 14, change "affect" to -- effect --
Line 55, change "minute" to -- minutes --

Column 10,
Line 7, change "affect" to -- effect --

Signed and Sealed this

Twenty-third Day of July, 2002

Attest:

JAMES E. ROGAN
Attesting Officer
Director of the United States Patent and Trademark Office